United States Patent [19]

Uratsuji

[11] Patent Number: 5,476,174
[45] Date of Patent: Dec. 19, 1995

[54] IC CARRIER

[75] Inventor: Kazumi Uratsuji, Tokyo, Japan

[73] Assignee: Yamaichi Electronics Co., Ltd., Tokyo, Japan

[21] Appl. No.: 208,698

[22] Filed: Mar. 11, 1994

[30] Foreign Application Priority Data

Mar. 12, 1993 [JP] Japan ................................ 5-078888

[51] Int. Cl.⁶ .................................................. B65D 73/02
[52] U.S. Cl. ........................................ 206/722; 206/701
[58] Field of Search ................................ 206/328, 329, 206/334

[56] References Cited

U.S. PATENT DOCUMENTS

| 4,901,853 | 2/1990 | Maryatt | 206/334 |
| 5,035,322 | 7/1991 | Faes et al. | 206/334 X |
| 5,109,980 | 5/1992 | Matsuoka et al. | 206/328 |

Primary Examiner—Jacob K. Ackun
Attorney, Agent, or Firm—Wenderoth, Lind & Ponack

[57] ABSTRACT

An IC carrier comprising first and second blocks, the second block is relatively movably engaged in the second block; first and second side regulation portions formed on the first and second blocks, respectively, and adapted to pressure contact opposite side faces of an IC in the sense of a lateral direction of the IC, respectively; a bottom regulation portion formed on at least one of the first and second side regulation portions and adapted to support a bottom face of the IC captured between the first and second side regulation portions; and a spring disposed between the first and second blocks such that the first and second blocks are normally biased and relatively slid, by a resilient force of the spring, in a direction reducing a distance between the first and second side regulation portions, so that the first and second side regulation portions are brought into pressure contact with the opposite side faces of the IC when the IC is inserted into the carrier.

17 Claims, 4 Drawing Sheets

IC CARRIER

BACKGROUND OF THE INVENTION

1. Field of the Invention

This invention relates to an IC carrier for holding or carrying thereon an IC so as to be transported, stored or electrically connected to a socket.

2. Prior Art

Japanese Utility Model Publication No. Hei 4-41103 discloses an IC carrier comprising two blocks which are placed in laterally spacedly parallel relation and connected together through a spring. This IC carrier has such a construction that the two blocks are movable in a direction toward and away from each other under a resilient force of the spring, and a guide member for guiding the two blocks is provided between the two blocks, the two blocks being opened to receive an IC therebetween by pulling the two blocks outwardly in such a manner as to expand the spring. The IC is held between inner end faces of the two blocks by moving the two blocks inwardly under a contracting force of the spring, leads projecting sidewardly from the IC being supported in grooves formed in a surface of each block.

However, in this conventional IC carrier, the two blocks are opened by grasping one of the blocks with one hand and the other block with the other hand, and while maintaining this condition, the IC must be inserted and removed from the IC carrier.

This is inconvenient indeed because the IC must be held with one hand, the two blocks must be opened with two hands and the IC must be dropped between the two blocks. Accordingly, the working efficiency for inserting and removing the IC is poor. Moreover, the IC will likely not be inserted in a favorable attitude, which often results in deformation of the leads and the like. In addition, the IC will likely not be correctly captured between the two blocks when the two blocks are moved toward each other by a contracting force of the spring, and thus there is a possibility that the IC will be dropped or will escape.

The conventional IC carrier of the type just mentioned can be used for an IC of the type in which the leads are supported on the two blocks. However, the above IC carrier cannot be used for a leadless IC because the size becomes too large for practical use.

OBJECT AND SUMMARY OF THE INVENTION

It is therefore an object of the present invention to provide an IC carrier, in which an IC can be inserted into and removed from the carrier in an efficient manner.

Another object of the present invention is to provide an IC carrier, in which an IC can be captured or held in a correct posture when inserted in the carrier.

A further object of the present invention is to provide an ICs carrier which can be suitably used for IC having a variety of sizes (common manufacturing differences and tolerances).

To achieve the above objects, there is essentially provided an IC carrier comprising first and second blocks, the second block being relatively movably engaged in the second block; first and second side regulation portions formed on the first and second blocks, respectively, and adapted to pressure contact opposite side faces of an IC in the sense of a lateral direction of the IC, respectively; a bottom regulation portion formed on at least one of the first and second side regulation portions and adapted to support a bottom face of the IC captured between the first and second side regulation portions; and a spring disposed between the first and second blocks such that the first and second blocks are normally biased and relatively slid, by a resilient force of the spring, in a direction reducing a distance between the first and second side regulation portions, so that the first and second side regulation portions are brought into pressure contact with the opposite side faces of the IC when the IC is inserted into the carrier.

DETAILED DESCRIPTION OF THE EMBODIMENTS

Figure 1:
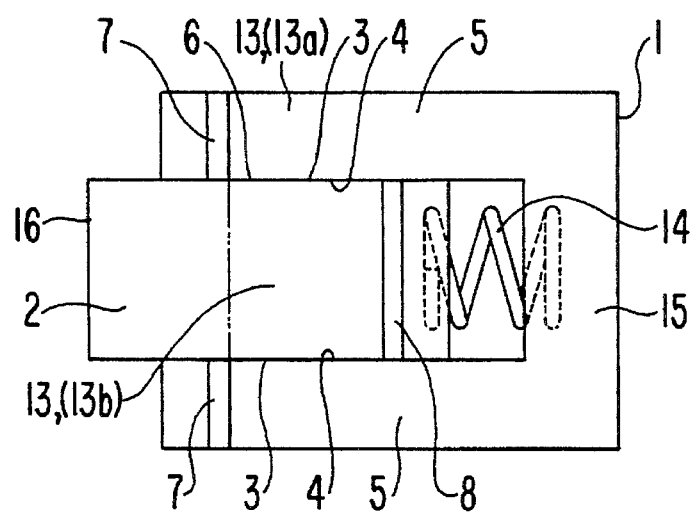
FIG. 1 is a plan view of an IC carrier according to one embodiment of the present invention.
Figure 2:
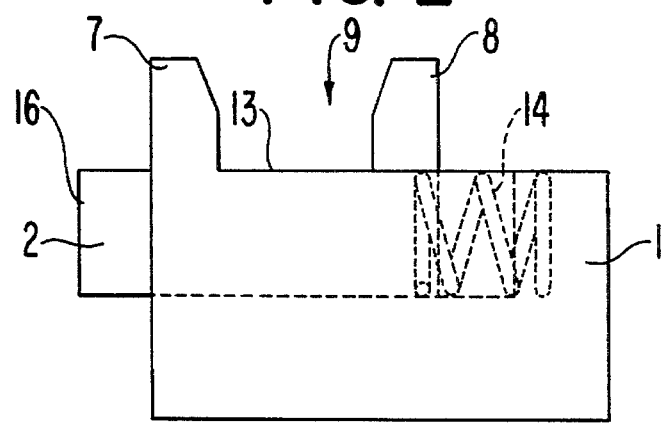
FIG. 2 is a side view of the IC carrier of FIG. 1.

Embodiments of the present invention will be described with reference to FIGS. 1 to 6, and then another embodiment of the present invention will be described with reference to FIGS. 7 to 11.

In FIGS. 1 to 6, reference numerals 1 and 2 denote first and second blocks, respectively, which form an IC carrier. The first and second blocks 1 and 2 are slidably engaged with each other at engagement portions thereof.

The first block 1 has two opposite parallel inner side faces 3, while the second block 2 has two opposite parallel outer side faces 4. The second block 2 is fitted or engaged in the first block 1 such that the inner and outer side faces 3 and 4 are relatively slidably contacted with each other, and the slidably contacting faces serve as a guide.

This will be described in more detail with reference to the illustrated embodiments. The first block 1 has a pair of side walls 5 extending in a parallel relation to each other and an engagement space 6 defined by and between the side walls 5. The second block 2 having the opposite parallel side faces 4 is fitted or engaged in this engagement space 6. In other words, the first and second blocks are of a nesting structure. At this nesting structure portion, the outer side faces 4 of the second block 2 are slidably contacted with the inner side faces 3 of the side walls 5 of the first block 1, so that the first and second blocks 1 and 2 can be relatively slidingly moved such that the slidably contacting faces serve as a guide.

The (or front) block 1 is provided with a first side regulation portion 7 adapted to pressure contact one of the opposite side faces (i.e. the front face) 11 of an IC 10, while the second block 2 is provided with a second (or rear) side regulation portion 8 adapted to pressure contact the other (rear) side face 11 of the IC 10.

With reference to FIGS. 1 to 6, the first side regulation portion 7 is comprised of a rib-like wall extending across a surface of an end portion (front end portion) of each side wall 5, while the second side regulation portion 8 is comprised of a rib-like wall extending across a surface of that end (i.e. the rear end) portion of each side wall 5 opposite to the first block 1.

The second regulation portion 8 is located on a middle line of the first regulation portion 7, so that the first regulation portion 7 is pressure contacted with both ends of one side face 11 of the IC 10 and the second regulation portion 8 is pressure contacted with a central portion of the other side face 11 of the IC 10.

A bottom regulation portion 13 for supporting a bottom face of the IC 10 captured between the first and second side regulation portions 7 and 8 is formed on one or both of the first and second blocks 1 and 2, and an IC receiving space 9 is defined by the first and second regulation portions 7 and 8 and the bottom regulation portion 13.

In FIGS. 1 to 6, the surfaces of the side walls 5 of the first block 1 are coplanar with the surface of the second block 2 at least between the first and second regulation portions 7 and 8, and seat faces 13a and 13b for supporting a bottom face of the IC 10 are formed by the surfaces of the first and second blocks 1 and 2, respectively. In this sense, the seat surfaces 13a and 13b form the bottom regulation portion 13.

As a result, the IC 10 is supported at its bottom surface central porion by the seat surface 13b and at its bottom surface opposite ends by the other seat surface 13b.

One of hte seat surfaces, the seat surface 13b of the second block 2, for example, can be formed lower than the other seat surface 13a, so that opposite ends of the bottom face of the IC 10 are stably supported only by the seat surface 13a.

The first and second blocks 1 and 2 are resiliently held by a spring 4 which is disposed between the first and second blocks and adapted to act in the sliding direction. This spring 14 acts on the first and second blocks 1 and 2 in a direction which will reduce a distance between the first and second side regulation portions 7 and 8 (i.e. a horizontal direction parallel to the inner surfaces 3). In other words, the spring 14 normally acts on the first and second blocks 1 and 2 so that the first and second blocks 1 and 2 are slid in the above-mentioned direction by its stored resilient force.

Figure 3:
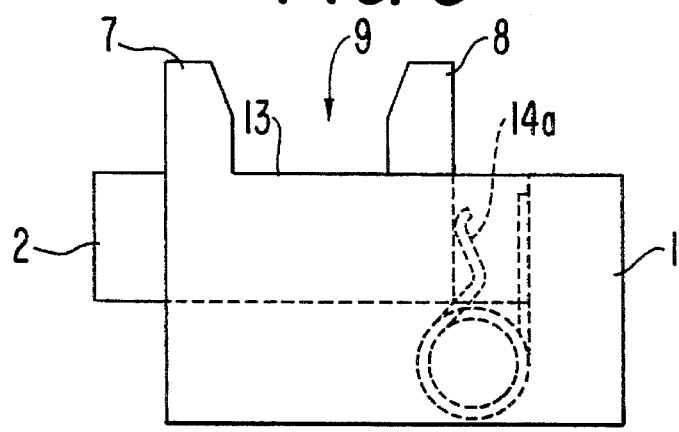
FIG. 3 is a side view of an IC carrier according to another embodiment of the present invention.
Figure 6:
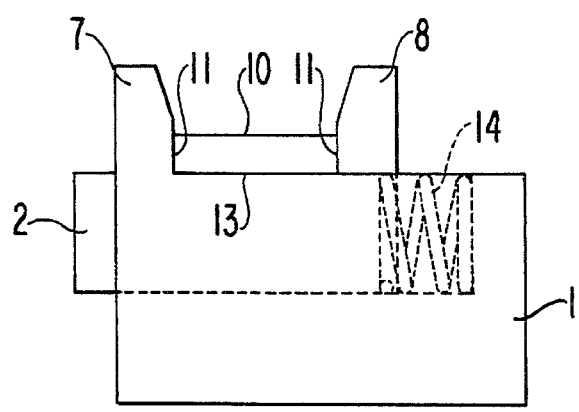
FIG. 6 is a side view of an IC carrier in which an IC is captured at opposite sides thereof by the first and second side regulation portions which have been slid in a direction reducing a distance between the first and second side regulation portions.
Figure 7:
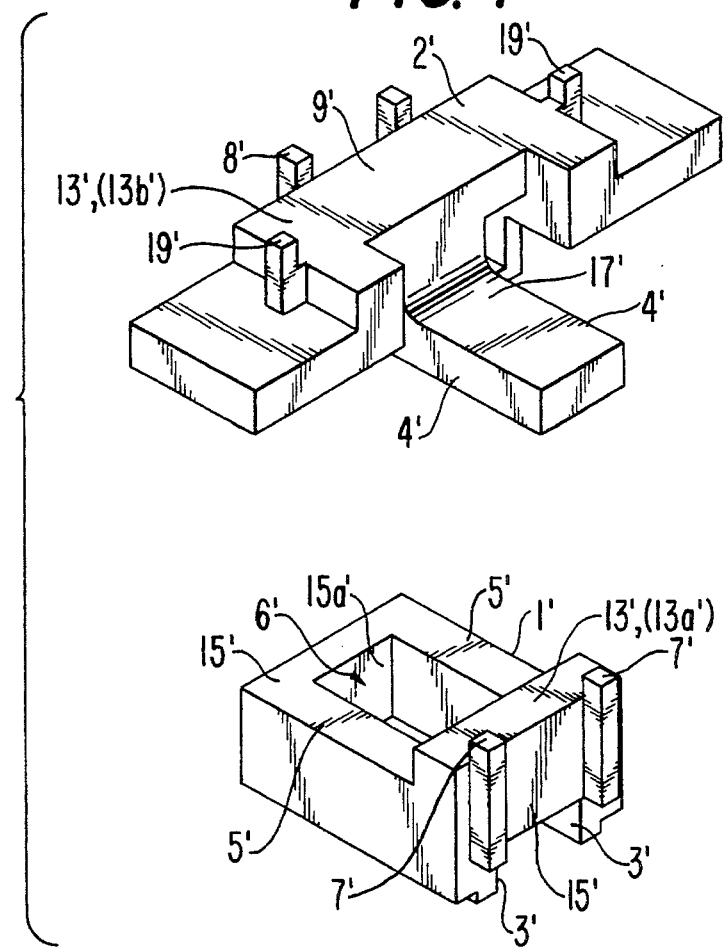
FIG. 7 is an exploded perspective view of an IC carrier according to a further embodiment of the present invention.
Figure 8:
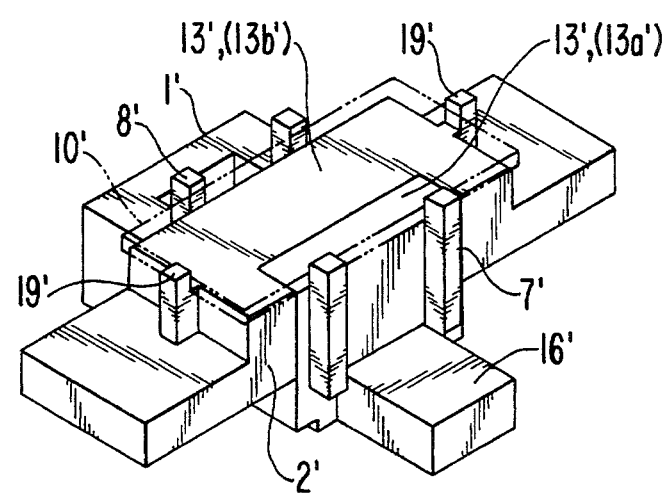
FIG. 8 is a perspective view of the IC carrier of FIG. 7 but which is in an assembled condition.
Figure 9:
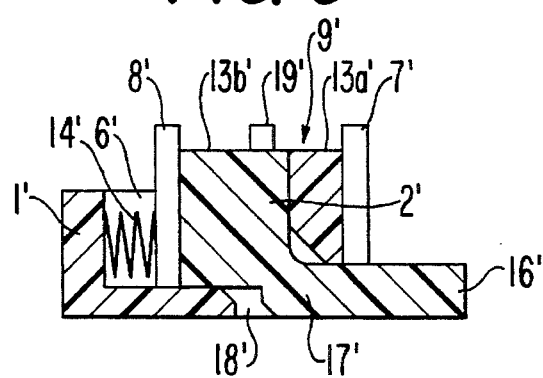
FIG. 9 is a cross-sectional view of the IC carrier of FIG. 8.

The concrete examples shown in FIGS. 1 and 6 will be described in more detail. The spring 14 is disposed between the end portion of the second block 2 on the side where the second regulation portion 8 is formed and that side of the first block 1 opposite to the side where the first regulation portion 7 is formed, such that the first and second blocks 1 and 2 are biased in the opposite directions by the spring 14. As one preferred example, a coil spring is used for this spring 14. One end of the coil spring 14 is supported by an end face of the second block 2 and the other end thereof is supported by an inner side face of a side wall 15 which connects the side walls 5 of the first block 1. As shown in FIG. 3, a forked spring 14a can be used in place of the coil spring 14a. This forked spring 14 is disposed between the first and second blocks 1 and 2 such that the first and second blocks 12 are normally slid in the opposite directions by the resilient forced of the forked spring 14a.

Figure 4:
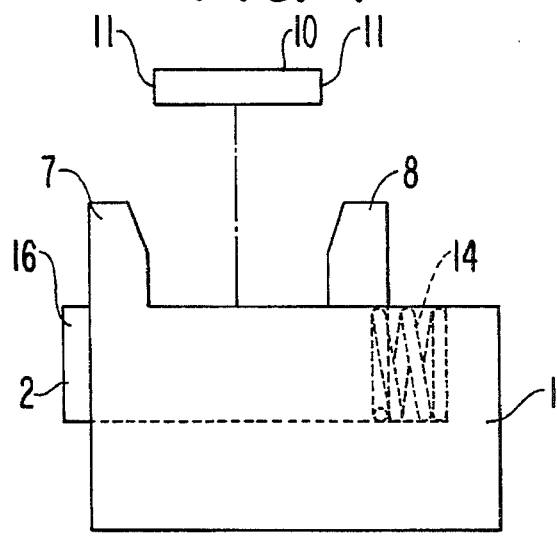
FIG. 4 is a side view of an IC carrier in which first and second regulation portions are in open position.
Figure 5:
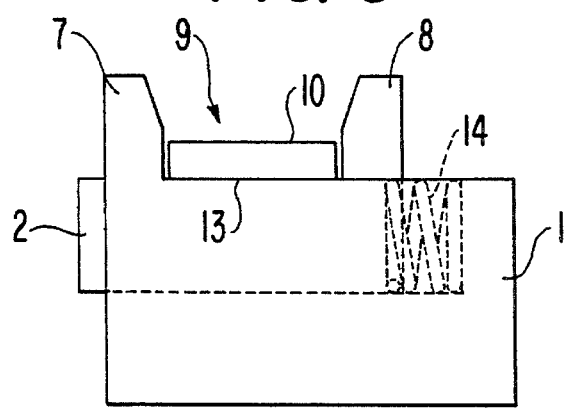
FIG. 5 is a side view of an IC carrier in which an IC is received between the first and second side regulation portions which are in open position.

As shown in FIG. 4, when the first block 1 is grasped with one hand and the end portion (operating portion 16) of the second block 2 is pushed (in the rearward direction) by a finger of this hand, the second block 2 is slid in one direction while compressing the spring 14, and a distance between the first and second regulation portions 7 and 8, i.e., a width of the IC receiving space 9, is increased to allow the insertion of the IC 10 as shown in FIG. 5.

The operating portion 16, which is exposed from one end of the first block 1, is formed on that end of the second block 2 opposite to the side where the second regulation portion 8 is formed. The IC 10 received in the IC receiving space 9 is supported at a bottom face thereof by the seat surfaces 13a and 13b which form the bottom regulation portion 13, but the opposite side faces 11 are left free.

In the condition shown in FIG. 5, when the pressure to the second block 2 is removed, the second block 2 is slid in the direction (forward direction) opposite to the pressurizing (or pushing) direction in accordance with the resilient force of the spring 14. In other words, the first and second blocks 1 and 2 are moved relative to each other, under the effect of the spring 14, to reduce the distance between the first and second side regulation portions 7 and 8. As a result, as shown in FIG. 6, the first and second side regulation portions 7 and 8 are pressure contacted with the opposite side faces of the IC 10 to elastically capture the IC 10.

In this case, the first and second blocks 1 and 2 may be provided with another regulation portion for regulating the side faces which are not restricted by the first and second side regulation portions 7 and 8. One example of this regulation portion is shown in FIGS. 7 to 11.

FIGS. 7 to 11 show another embodiment of an IC carrier embodied based on the idea shown in FIG. 1 to 6. The embodiment of FIGS. 7 to 11 will now be described.

The first block 1' has a square engagement space 6' which is opened upwardly. The second block 2' is engaged in this engagement space 6' to form a nesting structure (or mutually engaging structure).

More specifically, a slide element 17' of a generally L-shape, extends from a bottom portion of the second block 2', and this slide element 17' is brought into engagement in the engagement space 6' and pierced all the way through a through-hole 18' formed in a bottom wall of the engagement space 6' so as to be exposed outside the first block 1'. The exposed end of the slide element 17' defines a operating portion 16'. The first and second blocks 1' and 2' are slid relative to each other such that the slidably contacting faces, constituted by a pair of opposite parallel outer side faces 4' of the slide element 17' of the second block 2' which has been engaged in the engagement space 6' and a pair of opposite parallel inner faces 3' of the through-hole 18' of the first block 1' as a guide. In this case, a lower face of the second block 2' exposed from an open face of the receiving space 6' is supported on an upper face of the side wall 5' which defines the receiving space of the first block 1', so that this face may serve as a guide face for the sliding action.

That is, the second block 2' is brought into engagement in the first block 1' (nesting structure), and the relative sliding is achieved so that the slidably contacting faces constituted by the inner faces of the first block 1' and inner faces of the second block 2 serve as a guide in this nesting structure.

One end portion of the first block 1' in the sliding direction is provided with a first (or front) side regulation portion 7' which is to be pressure contacted with one of the opposite side faces of the IC 10', and that end portion of the second block 2' opposite to the first regulation portion 7' in the sliding direction is provided with a second (or rear) side portion 8'.

The first and second side regulation portions 7' and 8' are comprised of projection elements which are arranged in a spaced apart manner. In other words, a plurality of such projecting elements projecting from the surfaces of the first and second blocks 1' and 2' are arranged in a spaced apart manner, and these projecting elements serve as the side regulation portions.

The outer surfaces of the first and second blocks 1' and 2', which are present inside of the side regulation portions 7' and 8' are coplanar, and the seat faces 13a and 13b supporting the bottom face of the IC 10' are formed by these outer surfaces. Accordingly, the seat faces 13a' and 13b' cooperate to support the bottom surface of the IC 10'. These seat faces 13a' and 13b' form the bottom regulation portion 13'.

The seat faces, i.e., the bottom regulation portion 13' may be formed by the surface of one of the blocks 1' and 2' in the same manner as described above in connection with the embodiment of FIGS. 1–6.

A spring 14' is disposed between the first and second blocks 1' and 2', so that the first and second blocks 1 and 2 are biased in one sliding direction, i.e., in the direction to reduce the distance (IC receiving space) between the first and second side regulation portions 7' and 8'.

The engagement space 6' is defined by a pair of opposite side walls 5' and another pair of opposite side walls 15'. The spring 14' is received in this engagement space 6'. One end of the spring 14' is supported by an inner face 15a' of one of the opposite side walls 15' and the other end of the spring 14' is supported by the end face of the second block 2', which is opposite the inner face 15a' so that the first and second blocks 1' and 2' are biased in opposite directions, i.e. in the directions to reduce the distance between the first and second side regulation portions 7' and 8'.

Figure 10:
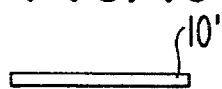
FIG. 10 is a cross-sectional view of the IC carrier of FIG. 8 but in which the first and second side regulation portions are in open position.
Figure 10:
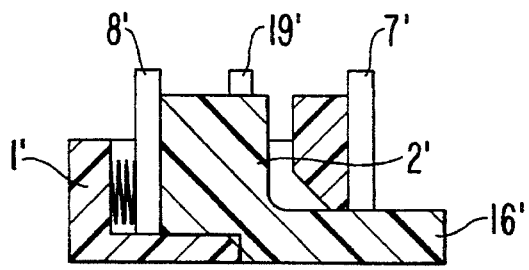

As shown in FIG. 10, when the first block 1' is grasped with one hand at the back side of the first block 1' and the operating portion 16' is pushed by a free finger of this hand, the second block 2' is slid in one direction so as to compress the spring 14' and open or widen the distance (IC receiving space) 9' between the first and second side regulation portions 7' and 8' to allow the insertion of the IC 10'.

Figure 11:
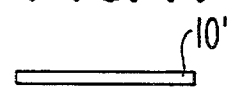
FIG. 11 is a cross-sectional view of the IC carrier of FIG. 8 but in which an IC is captured at opposite sides thereof by the first and second side regulation portions which have been slid in a direction reducing a distance between the first and second side regulation portions.
Figure 11:
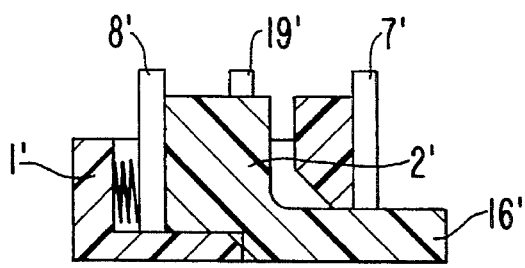

When the pressure to the second block 2' is removed after the IC has been received and supported by the bottom regulation portion 13', the second block 2', as shown in FIG. 11, is slid in the other direction in accordance with the biasing force of the spring 14', i.e., in the direction to reduce the distance between the first and second side regulation portions 7' and 8' to cause the first and second side regulation portions 7' and 8' to be pressure contacted with the opposite side faces of the IC 10', so that the IC 10' is positively captured between the first and second side regulation portions 7' and 8'.

By virtue of the arrangement that the first and second side regulation portions 7' and 8' are comprised of a plurality of projecting elements which are spacedly arranged, the IC 10' can be held in a stable manner and without rattling.

The IC 10' has a pair of side faces which are not restricted by the first and second regulation portions 7' and 8', and the first and second blocks 1' and 2' have a pair of lateral side regulation portions 19' for regulating this pair of opposite side faces which are not restricted by the first and second regulation portions 7' and 8'. The regulation portions 19' are comprised of a pair of rib-like walls extending along the opposite side faces of the IC 10', or a plurality of projecting elements arranged in a spaced apart manner as illustrated, as in the case with the first and second side regulation portions 7' and 8'. The regulation portions 19' serve as means for regulating one pair of opposite side faces (in the direction) of the IC 10' without being pressure contacted with the pair of side faces of the IC 10' and without positively pressurizing the side faces.

In the illustrated example, the regulation portions 19' are provided on only one of the first and second blocks 1' and 2'. However, the regulation portions 19' may be separately provided on the first and second blocks 1' and 2'.

According to the present invention, the opening and closing operation of the first and second blocks, which constitute the IC carrier, can be carried out easily, and an IC can be inserted and removed smoothly and easily. Moreover, the IC carrier of the present invention can be suitably used for IC's having a variety of sizes.

Since the first and second blocks can be slid relative to each otehr in a stable manner by having the counterpart blocks serve as guides, the IC receiving portion can smoothly be enlarged and reduced in size.

Furthermore, since the need for a provision of a separate member for guiding the relative sliding for the first and second blocks can be eliminated, the IC carrier can be made small.

Since the IC can be correctly and positively captured by causing the first and second side regulation portions to be pressure contacted with the opposite side faces of the IC, the present invention can suitably be applied to a leadless IC carrier in which IC contacts are exposed from an open face of an IC receiving portion so as to be electrically connected to a socket, while the side faces of the IC are captured.

What is claimed is:

1. An IC carrier comprising:

a first block having a front end, a rear end and a pair of opposed side walls extending parallel to one another, said opposed side walls having respective inner surfaces between which is defined an engagement space;

a second block having a front end, a rear end and opposed outer surfaces extending parallel to one another, said second block being movably mounted in said engagement space for movement in a horizontal direction parallel to said inner surfaces such that said inner surfaces of said first block constitute guides for said outer surfaces of said second block;

at least one of said first block and said second block having an upper surface constituting a bottom regulation portion on which an IC can be supported;

front and rear side regulation portions protruding upwardly above said bottom regulation portion from said first and second blocks, respectively, said front and rear side regulation portions being disposed opposite one another with respect to said horizontal direction parallel to said inner surfaces so as to define therebetween an IC receiving portion;

at least one of said first and second blocks including at least one lateral side regulation portion protruding upwardly therefrom above said bottom regulation portion, said at least one lateral side regulation portion being disposed at a lateral side of said IC receiving portion; and a spring interposed between said first block and said second block and urging said second block to slide relative to said first block in said horizontal direction parallel to said inner surfaces of said first block and such that said front and rear side regulation portions are biased toward one another.

2. An IC carrier as recited in claim 1, wherein said spring is mounted in said engagement space.

3. An IC carrier as recited in claim 1, wherein said front side regulation portion comprises a pair of upwardly projecting walls spaced apart from one another on opposite sides of said engagement space, said second block being slidably disposed between said upwardly projecting walls of said front side regulation portion.

4. An IC carrier as recited in claim 1, wherein each of said front and rear side regulation portions comprises a plurality of spaced apart projection elements.

5. An IC carrier as recited in claim 1, wherein a front end portion of said second block constitutes an operating portion which protrudes forwardly from said engagement space beyond said front end of said first block.

6. An IC carrier as recited in claim 5, wherein said operating portion constitutes a means for sliding said second block against a biasing force of said spring, and for moving said rear regulation portion rearwardly and away from said front regulation portion, upon imposition of a rearwardly directed force to said operating portion.

7. An IC carrier as recited in claim 1, wherein said bottom regulation portion is constituted by a first bottom regulation portion formed by an upper surface portion of said first block and a second bottom regulation portion formed by an upper surface portion of said second block.

8. An IC carrier as recited in claim 7, wherein said first bottom regulation portion is disposed forwardly of at least part of said second bottom regulation portion.

9. An IC carrier as recited in claim 7, wherein said at least one lateral side regulation portion comprises a pair of opposing lateral side regulation portions disposed on opposing lateral sides of said IC receiving portion.

10. An IC carrier comprising:

a first block having a front end, a rear end and a pair of opposed side walls extending parallel to one another, said opposed side walls having respective inner surfaces between which is defined an engagement space;

a second block having a front end, a rear end and opposed outer surfaces extending parallel to one another, said second block being movably mounted in said engagement space for movement in a horizontal direction parallel to said inner surfaces such that said inner surfaces of said first block constitute guides for said outer surfaces of said second block;

at least one of said first block and said second block having an upper surface constituting a bottom regulation portion on which an IC can be supported;

front and rear side regulation portions protruding upwardly above said bottom regulation portion from said first and second blocks, respectively, said front and rear side regulation portions being disposed opposite one another with respect to said horizontal direction parallel to said inner surfaces so as to define therebetween an IC receiving portion;

a spring interposed between said first block and said second block and urging said second block to slide relative to said first block in said horizontal direction parallel to said inner surfaces of said first block and such that said front and rear side regulation portions are biased toward one another; and wherein a front end portion of said second block constitutes an operating portion which protrudes forwardly from said engagement space beyond said front end of said first block.

11. An IC carrier as recited in claim 10, wherein said operating portion constitutes a means for sliding said second block against a biasing force of said spring, and for moving said rear regulation portion rearwardly and away from said front regulation portion, upon imposition of a rearwardly directed force to said operating portion.

12. An IC carrier as recited in claim 10, wherein said spring is mounted in said engagement space.

13. An IC carrier as recited in claim 10, wherein said front side regulation portion comprises a pair of upwardly projecting walls spaced apart from one another on opposite sides of said engagement space, said second block being slidably disposed between said upwardly projecting walls of said front side regulation portion.

14. An IC carrier as recited in claim 10, wherein each of said front and rear side regulation portions comprises a plurality of spaced apart projection elements.

15. An IC carrier as recited in claim 10, wherein said bottom regulation portion is constituted by a first bottom regulation portion formed by an upper surface portion of said first block and a second bottom regulation portion formed by an upper surface portion of said second block.

16. An IC carrier as recited in claim 15, wherein said first bottom regulation portion is disposed forwardly of at least part of said second bottom regulation portion.

17. An IC carrier as recited in claim 15, wherein said first bottom regulation portion comprises a pair of spaced apart sections, and said second bottom regulation portion is disposed between said spaced apart sections of said first bottom regulation portion.

\* \* \* \* \*